United States Patent
Fu

(10) Patent No.: US 9,632,232 B2
(45) Date of Patent: Apr. 25, 2017

(54) BACKLIGHT, BACKLIGHT MODULE AND DISPLAY DEVICE

(71) Applicants: BOE TECHNOLOGY GROUP CO., LTD., Beijing (CN); Beijing BOE Vision-Electronic Technology Co., Ltd., Beijing (CN)

(72) Inventor: Changjia Fu, Beijing (CN)

(73) Assignees: BOE TECHNOLOGY GROUP CO., LTD., Beijing (CN); BEIJING BOE VISION-ELECTRONIC TECHNOLOGY CO., LTD., Beijing (CN)

(*) Notice: Subject to any disclaimer, the term of this patent is extended or adjusted under 35 U.S.C. 154(b) by 217 days.

(21) Appl. No.: 14/518,289

(22) Filed: Oct. 20, 2014

(65) Prior Publication Data

US 2015/0370004 A1     Dec. 24, 2015

(30) Foreign Application Priority Data

Jun. 20, 2014 (CN) .......................... 2014 1 0279468

(51) Int. Cl.
  *F21V 7/04* (2006.01)
  *F21V 8/00* (2006.01)
  (Continued)

(52) U.S. Cl.
  CPC ........... *G02B 6/0073* (2013.01); *G02B 6/009* (2013.01); *H05K 1/189* (2013.01); *H05K 1/028* (2013.01);
  (Continued)

(58) Field of Classification Search
  CPC ...... G02B 6/0073; G02B 6/009; H05K 1/189; H05K 2201/10106; H05K 1/028; H05K 3/0061
  (Continued)

(56) References Cited

U.S. PATENT DOCUMENTS 7,123,316 B1 * 10/2006 Yang .................... G02B 6/0016
                                                                    349/64
8,814,415 B2 * 8/2014 Kim ....................... G02B 6/002
                                                                    362/600
(Continued)

FOREIGN PATENT DOCUMENTS

CN        101071227 A      11/2007
CN        201017141 Y       2/2008
(Continued)

OTHER PUBLICATIONS

Machine English Translation of CN201017141Y Fangyi Zhou Feb. 6, 2008.*

(Continued)

*Primary Examiner* — Bao Q Truong
*Assistant Examiner* — Glenn Zimmerman
(74) *Attorney, Agent, or Firm* — Nath, Goldberg & Meyer; Joshua B. Goldberg

(57) ABSTRACT

The invention discloses a backlight, a backlight module and a display device, belonging to the field of display technology. The backlight includes a plurality of LED lamps, a flexible circuit board for supplying power to the LED lamps and a supporting plate for supporting the flexible circuit board, wherein the flexible circuit board is arranged below the LED lamps, and the supporting plate is arranged below the flexible circuit board and is in a bent shape. In the present invention, by designing the supporting plate to be in a bent shape, it is no longer required to have to employ the existing linear backlight with a single structure, and meanwhile, the contact area between the supporting plate and air is enlarged to improve the heat dissipation effect of the backlight.

10 Claims, 1 Drawing Sheet

(51) Int. Cl.
*H05K 1/18* (2006.01)
*H05K 1/02* (2006.01)
*H05K 3/00* (2006.01)

(52) U.S. Cl.
CPC . *H05K 3/0061* (2013.01); *H05K 2201/10106* (2013.01)

(58) Field of Classification Search
USPC .............. 362/612, 621, 97.1, 97.2, 97.3
See application file for complete search history.

(56) References Cited

U.S. PATENT DOCUMENTS

| | | | | |
|---|---|---|---|---|
| 2008/0291697 | A1* | 11/2008 | Sun | G02B 6/0088 362/628 |
| 2010/0002465 | A1* | 1/2010 | Tsang | G02B 6/0021 362/612 |
| 2011/0163683 | A1* | 7/2011 | Steele | F21K 9/135 315/192 |
| 2013/0308340 | A1* | 11/2013 | Que | G02F 1/133615 362/612 |
| 2014/0369033 | A1* | 12/2014 | Palfreyman | F21V 21/14 362/183 |

FOREIGN PATENT DOCUMENTS

| | | |
|---|---|---|
| CN | 201133990 Y | 10/2008 |
| CN | 102121606 A | 7/2011 |
| CN | 103486492 A | 1/2014 |
| CN | 103672575 A | 3/2014 |
| EP | 2275846 A1 | 1/2011 |
| JP | 2011128599 A | 6/2011 |

OTHER PUBLICATIONS

First Office Action dated Nov. 4, 2015 corresponding to Chinese application No. 201410279468.9.

* cited by examiner

BACKLIGHT, BACKLIGHT MODULE AND DISPLAY DEVICE

CROSS-REFERENCE TO RELATED APPLICATIONS

This application claims the priority of Chinese in China Application No. 201410279468.9 filed on Jun. 20, 2014, the entire content of which is incorporated herein by reference.

FIELD OF THE INVENTION

The present invention relates to the field of display technology, and in particular relates to a backlight, a backlight module and a display device.

BACKGROUND OF THE INVENTION

A backlight is an important component of a liquid crystal display device such as a mobile phone, a display, and the existing backlight on the market typically has a flat-plate-shaped structure. The flat-plate-shaped backlight is not only single in shape, but also extremely poor in heat dissipation effect.

As a light emitting device of the backlight, a light emitting diode (LED for short) has a special temperature property, namely, the brightness of an LED lamp declines with the rise of an environment temperature. Therefore, after the backlight works for a long time, the brightness of the LED lamp declines with the rise of the working environment temperature, so as to affect the display effect of a display device.

SUMMARY OF THE INVENTION

Embodiments of the present invention provide a backlight, a backlight module and a display device, which can effectively improve the heat dissipation effect of the display device.

To achieve the above-mentioned purpose, the present invention provides a backlight, which includes a plurality of LED lamps, a flexible circuit board for supplying power to the LED lamps and a supporting plate for supporting the flexible circuit board, wherein the flexible circuit board is arranged below the LED lamps, and the supporting plate is arranged below the flexible circuit board and is in a bent shape.

For example, the cross section of the supporting plate is in a periodic wave shape or a periodic sawtooth shape.

For example, the cross section of the supporting plate is in the periodic sawtooth shape, the lengths of two sides of each sawtooth part are equal, and the included angle formed by the two sides is in a range of 115°-125°.

For example, the supporting plate is made of a metal material.

For example, the metal material is aluminum.

For example, the backlight further includes heat conductive adhesive arranged between the flexible circuit board and the supporting plate.

To achieve the above-mentioned purpose, the embodiments of the present invention further provide a backlight module, which includes the above-mentioned backlight and a light guide plate opposite to the backlight.

For example, the light guide plate and the backlight are matched with each other in shape.

For example, positioning lugs are arranged on two respective sides of the light guide plate, and the positioning lugs are to be matched with an outer frame of a display device to fix the light guide plate in the outer frame.

To achieve the above-mentioned purpose, the present invention further provides a display device, which includes the above-mentioned backlight module.

The present invention has the following beneficial effects:

The embodiments of the present invention provide the backlight, the backlight module and the display device, wherein the backlight includes a plurality of LED lamps, the flexible circuit board for supplying power to the LED lamps and the supporting plate for supporting the flexible circuit board, the flexible circuit board is arranged below the LED lamps, and the supporting plate is arranged below the flexible circuit board and is in a bent shape. In the present invention, by designing the supporting plate to be in a bent shape, it is no longer required to employ the existing flat-plate-shaped backlight with a single structure, and meanwhile, the contact area between the supporting plate and air is enlarged to improve the heat dissipation effect of the backlight. On the other hand, when the backlight is arranged in the display device, a rear cover and a base in the display device may be saved, so that the production cost of the display device may be effectively reduced, and the heat dissipation capability of the display device may also be further improved.

DETAILED DESCRIPTION OF THE EMBODIMENTS

In order to make persons skilled in the art better understand the technical solutions of the present invention, a backlight, a backlight module and a display device provided by the present invention will be described in detail below in combination with the accompanying drawings.

Embodiment 1

Figure 1:
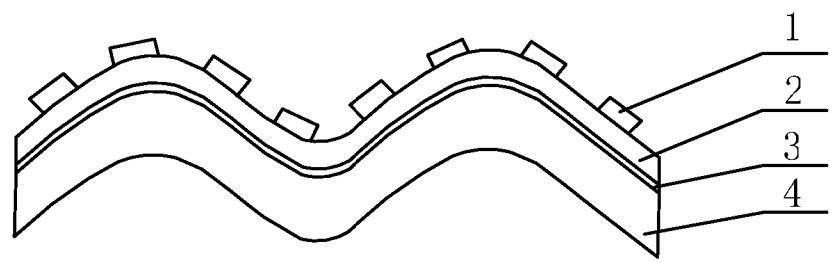
FIG. 1 is a schematic diagram of a structure of a backlight provided by Embodiment 1 of the present invention.

FIG. 1 is a schematic diagram of a structure of a backlight provided by Embodiment 1 of the present invention. As shown in FIG. 1, the backlight includes a plurality of LED lamps 1, a flexible circuit board 2 and a supporting plate 4, wherein the flexible circuit board 2 is arranged below the LED lamps 1, the supporting plate 4 is arranged below the flexible circuit board 2, the flexible circuit board 2 is configured to supply power to the LED lamps 1, and the supporting plate 4 is configured to support the flexible circuit board 2 and is in a bent shape. In this embodiment, the flexible circuit board 2 is attached to the supporting plate 4, and when the supporting plate 4 is deformed and bent, the flexible circuit board 2 is also deformed and bent, and the whole backlight is correspondingly bent.

It should be noted that, the LED lamps 1 in this embodiment may be a single LED or a LED light bar formed by a plurality of LEDs, and the LED lamps 1 may be attached to the flexible circuit board 2 by means of adhesive. Meanwhile, the arrangement manner of the LED lamps 1 on the flexible circuit board 2 may be correspondingly adjusted according to the bending condition of the flexible supporting plate 4, so that the backlight may produce uniform rays of light.

In the embodiment of the present invention, because the supporting plate 4 is in the bent shape, the single shape of the existing linear backlight is broken, and the contact area between the supporting plate 4 and air is enlarged to improve the heat dissipation effect of the supporting plate 4. Alternatively, the cross section of the supporting plate 4 is in the shape formed by sequentially connecting multiple waves or sawteeth.

In an implementation of the embodiment of the present invention, the cross section of the supporting plate 4 is in the shape formed by sequentially connecting multiple waves in the same shape (as shown in FIG. 1). Since bent structures on the supporting plate 4 are periodically arranged, each bent structure may be formed through a simple processing technique, thus simplifying the manufacturing process of the LED supporting plate 4.

Figure 2:
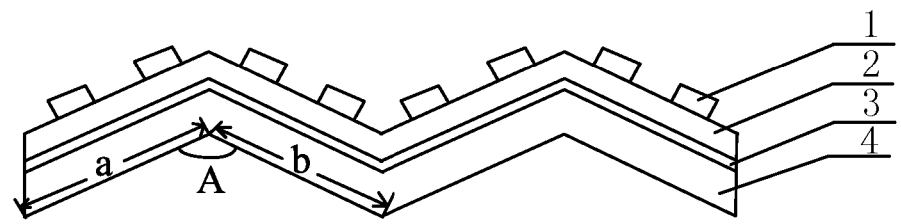
FIG. 2 is a schematic diagram of a supporting plate, the cross section of which is formed by sequentially connecting a plurality of sawteeth.

FIG. 2 is a schematic diagram of the supporting plate, the cross section of which is formed by sequentially connecting a plurality of sawteeth. As shown in FIG. 2, as another preferred solution, the cross section of the supporting plate 4 is in a sawtooth shape, the lengths of two sides of each sawtooth part are equal, namely, in FIG. 2, the side a and the side b are equal, and the vertex angle A formed by the two sides is in a range of 115°-125°; and when the included angle A is in the range of 115°-125°, the phenomenon of loss produced due to refraction or reflection of rays of light when the rays of light emitted from the LED lamps 1 enters a light guide plate may be reduced, so that the luminous efficiency of LEDs is ensured.

It should be noted that, the quantity and the arrangement of the bent structures included in the supporting plate 4 and the LED lamps 1 thereon in FIG. 1 and FIG. 2 are merely schematic, rather than limiting the technical solutions of the present invention.

Moreover, as the supporting plate 4 is required to have a bent structure, the supporting plate 4 should be made of a material with relatively low hardness and relatively good heat conductive performance, such as a metal material. Preferably, the supporting plate 4 is made of aluminum, and the aluminum material is low in hardness, good in heat conductivity, relatively low in purchase cost and convenient in processing.

In an implementation of the embodiment of the present invention, heat conductive adhesive 3 is also arranged between the flexible circuit board 2 and the supporting plate 4, and the heat conductive adhesive 3 may not only transfer the heat produced by the flexible circuit board 2 to the supporting plate 4 for dissipating heat, but also adhere the flexible circuit board 2 to the supporting plate 4, so as to keep the flexible circuit board 2 correspondingly bent.

In this embodiment, the flexible circuit board 2 and the supporting plate 4 may be assembled in the following two manners. Firstly, the flat-plate-shaped supporting plate 4 is bent to be in a predetermined shape, then the flexible circuit board 2 is also bent to be in a predetermined shape, the supporting plate 4 is coated with the heat conductive adhesive 3, and the supporting plate 4 and the flexible circuit board 2 which are in the same predetermined shape are adhered together to complete the assembly. Secondly, the flat-plate-shaped supporting plate 4 is coated with the heat conductive adhesive 3, the flexible circuit board 2 is adhered to the supporting plate 4, and the flat-plate-shaped supporting plate 4 and flat flexible circuit board 2, which are adhered together, are simultaneously bent to be in a predetermined shape to complete the assembly.

It should be noted that, when the bent shape of the supporting plate 4 is adjusted later, it is only required to directly adjust the overall structure formed by the flexible circuit board 2 and the supporting plate 4.

The Embodiment 1 of the present invention provides the backlight which includes a plurality of LED lamps, the flexible circuit board and the supporting plate, wherein the flexible circuit board is arranged below the LED lamps, the supporting plate is arranged below the flexible circuit board, the flexible circuit board is configured to supply power to the LED lamps, and the supporting plate is configured to support the flexible circuit board and is in the bent shape. In the present invention, by designing the supporting plate to be in a bent shape, it is no longer required to have to employ the existing linear backlight with a single structure, and meanwhile, the contact area between the supporting plate and air is enlarged to improve the heat dissipation effect of the backlight.

Embodiment 2

Figure 3:
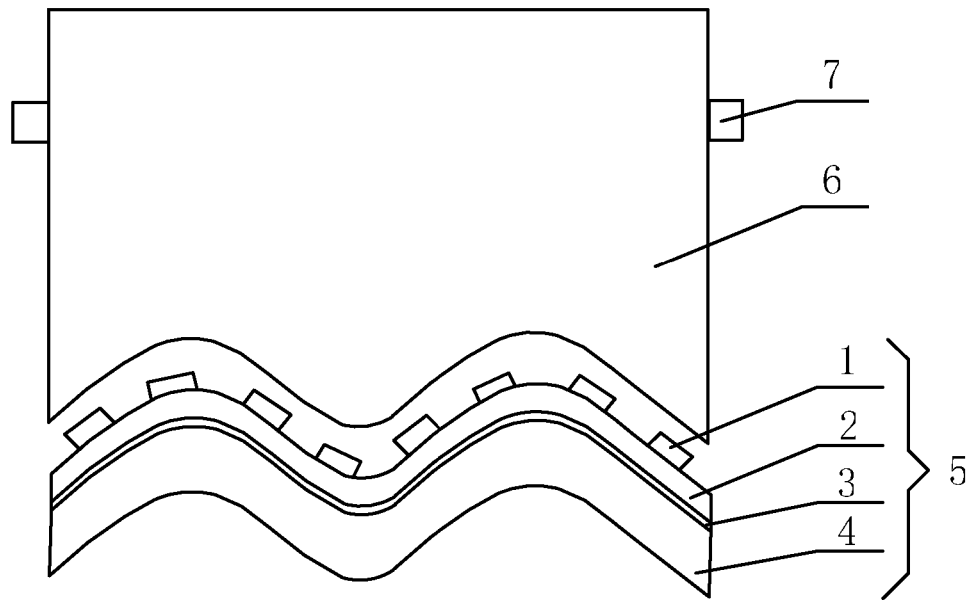
FIG. 3 is a schematic diagram of a structure of a backlight module provided by Embodiment 2 of the present invention.

FIG. 3 is a schematic diagram of a structure of a backlight module provided by Embodiment 2 of the present invention. As shown in FIG. 3, the backlight module includes a backlight 5 and a light guide plate 6 opposite to the backlight 5, wherein the backlight 5 is the one in Embodiment 1, which may be referred to Embodiment 1, and the description thereof will not be redundant herein.

In FIG. 3, the light guide plate 6 and the backlight 5 are matched with each other in shape. Specifically, one surface of the light guide plate 6 towards the backlight 5 and one surface of the backlight 5 towards the light guide plate 6 are in the same bent shape, namely, the surface of the light guide plate 6 towards the backlight 5 is correspondingly bent along with the bending of the supporting plate 4 (with the flexible circuit board 2), so that rays of light produced by the backlight 5 may uniformly enter the light guide plate 6, and rays of light emitted from the backlight module is relatively uniform.

The backlight module in this embodiment is the one used in a direct type display device. To ensure that the light guide plate 6 may be fixed in the display device, alternatively, a positioning lug 7 is arranged on each of the two sides of the light guide plate 6, a clamping slot is formed in correspondence to the positioning lug 7 in an outer frame (not shown in the figure) of the display device, and by arranging the positioning lug 7 in the clamping slot, the light guide plate 6 may be fixed with the outer frame.

Alternatively, the positioning lug 7 and the light guide plate 6 are formed integrally.

The Embodiment 2 of the present invention provides the backlight module, which includes the backlight and the light guide plate opposite to the backlight, wherein the backlight includes a plurality of LED lamps, the flexible circuit board and the supporting plate, the flexible circuit board is arranged below the LED lamps, the supporting plate is arranged below the flexible circuit board, the flexible circuit board is configured to supply power to the LED lamps, and the supporting plate is configured to support the flexible circuit board and is in a bent shape. In the present invention, by designing the supporting plate to be in a bent shape, it is no longer required to have to employ the existing linear backlight with a single structure, and meanwhile, the contact area between the supporting plate and air is enlarged, thus improving the heat dissipation effect of the backlight and then improving the performance of the backlight module.

Embodiment 3

Embodiment 3 of the present invention provides a display device, including a backlight module and an outer frame for fixing the backlight module, wherein the backlight module is the one provided in Embodiment 2, which may be referred to Embodiment 2, and the description thereof will not be redundant herein.

It should be noted that, in the display device provided by this embodiment, the backlight in the backlight module is provided with the bent supporting plate, and the bent supporting plate may directly function to protect the display device and serve as a base of a whole machine, thus it is not required to arrange a rear cover and a base at the positions (the back of the display device) corresponding to the supporting plate on the display device. Meanwhile, the design of the bent supporting plate may also effectively improve the aesthetic feeling of the whole machine. More importantly, with the technical solution of saving the rear cover and the base, the production cost of the display device may be reduced, and the heat dissipation capability of the display device may also be further improved.

It could be understood that, the above embodiments are merely exemplary embodiments adopted for describing the principle of the present invention, rather than limiting the present invention. Various modifications and improvements could be made for those of ordinary skills in the art without departing from the spirit and essence of the present invention, and these modifications and improvements may be considered to be within the protection scope of the present invention.

The invention claimed is:

1. A backlight, comprising a plurality of LED lamps, a flexible circuit board for supplying power to the LED lamps and a rigid supporting plate for supporting the flexible circuit board, wherein the flexible circuit board is arranged below the LED lamps, and the supporting plate is arranged below the flexible circuit board and is in a bent shape, wherein the cross section of the supporting plate is in a periodic sawtooth shape, the lengths of two sides of each sawtooth part are equal, and the included angle formed by the two sides is in a range of 115°-125°.

2. The backlight of claim 1, wherein the supporting plate is made of a metal material.

3. The backlight of claim 1, further comprising heat conductive adhesive arranged between the flexible circuit board and the supporting plate.

4. The backlight of claim 2, wherein the metal material is aluminum.

5. A backlight module, comprising the backlight and a light guide plate opposite to the backlight, the backlight comprising a plurality of LED lamps, a flexible circuit board for supplying power to the LED lamps and a rigid supporting plate for supporting the flexible circuit board, wherein the flexible circuit board is arranged below the LED lamps, and the supporting plate is arranged below the flexible circuit board and is in a bent shape, wherein the cross section of the supporting plate is in a periodic sawtooth shape, the lengths of two sides of each sawtooth part are equal, and the included angle formed by the two sides is in a range of 115°-125°.

6. The backlight module of claim 5, wherein the light guide plate and the backlight are matched with each other in shape.

7. The backlight module of claim 5, wherein positioning lugs are arranged on two respective sides of the light guide plate, and the positioning lugs are matched with an outer frame of a display device to fix the light guide plate in the outer frame.

8. A display device, comprising a backlight module comprising the backlight and a light guide plate opposite to the backlight, the backlight comprising a plurality of LED lamps, a flexible circuit board for supplying power to the LED lamps and a rigid supporting plate for supporting the flexible circuit board, wherein the flexible circuit board is arranged below the LED lamps, and the supporting plate is arranged below the flexible circuit board and is in a bent shape, wherein the cross section of the supporting plate is in a periodic sawtooth shape, the lengths of two sides of each sawtooth part are equal, and the included angle formed by the two sides is in a range of 115°-125°.

9. The display device of claim 8, wherein the light guide plate and the backlight are matched with each other in shape.

10. The display device of claim 8, wherein positioning lugs are arranged on two respective sides of the light guide plate, and the positioning lugs are matched with an outer frame of a display device to fix the light guide plate in the outer frame.

* * * * *